United States Patent [19]

Thoren et al.

[11] 4,147,994

[45] Apr. 3, 1979

[54] POWER COMBINER

[75] Inventors: Glenn R. Thoren, Arlington; James L. Lampen, Burlington; George Jerinic, Acton, all of Mass.

[73] Assignee: Raytheon Company, Lexington, Mass.

[21] Appl. No.: 929,630

[22] Filed: Jul. 31, 1978

[51] Int. Cl.² .............................................. H03B 7/06
[52] U.S. Cl. ........................................ 331/56; 331/101
[58] Field of Search .................... 331/56, 101, 102, 97, 331/96, 107; 325/105

[56] References Cited
U.S. PATENT DOCUMENTS

| | | | |
|---|---|---|---|
| 3,931,587 | 1/1976 | Harp et al. | 331/56 |
| 4,075,578 | 2/1978 | Dydyk | 331/56 |
| 4,083,016 | 4/1978 | Zangrando et al. | 331/56 |
| 4,090,152 | 5/1978 | Dydyk | 331/56 |
| 4,121,174 | 10/1978 | Aston | 331/56 |

Primary Examiner—John Kominski
Attorney, Agent, or Firm—Philip J. McFarland; Joseph D. Pannone

[57] ABSTRACT

A power combiner for solid state oscillator circuits is shown to be the combination of a central cavity and a plurality of subcavities, each one of the latter being dimensioned to operate in the $TM_{010}$ mode to synchronize a plurality of solid state oscillator circuits. The central cavity and each one of the plurality of subcavities are coupled together through coaxial lines so that the central cavity in turn synchronizes the plurality of subcavities.

5 Claims, 2 Drawing Figures

POWER COMBINER

BACKGROUND OF THE INVENTION

This invention pertains generally to solid-state radio frequency transmitters and particularly to transmitters of such type wherein energy generated by each one of a plurality of diode oscillators is combined to increase the level of the transmitted energy.

It is known in the art that diode oscillators, such as those using IMPATT diodes, may be arranged in an appropriate manner to combine the outputs of a plurality of such oscillators. Thus, as shown in U.S. Pat. No. 3,931,587, a plurality of coaxial oscillator circuits (each having an IMPATT diode as the source of continuous wave (CW) radio frequency energy) is disposed around the periphery of a cylindrical cavity so that, when such cavity is operated in the $TM_{010}$ mode, the CW radio frequency energy out of the coaxial oscillator circuits may be accumulated. Further, in the pending application, Ser. No. 814,743, entitled "Cylindrical Cavity Power Combiner for a Plurality of Coaxial Oscillators," Inventor George Jerinic, filed June 30, 1977, and assigned to the same assignee as this application, a similar arrangement is shown whereby pulses of radio frequency energy may be produced by injection-locking a plurality of coaxial oscillator circuits. In either arrangement, the number of coaxial oscillator circuits of a given size which may be disposed around the periphery of a cylindrical cavity is ultimately determined by the circumference of such cavity. That is to say, the amount of radio frequency energy which may be accumulated in the cylindrical cavity ultimately is limited by the number of coaxial oscillator circuits which may be located around the periphery of such a cavity.

Although it is, in theory at least, feasible to increase the number of coaxial oscillators in either of the just-mentioned arrangements by dimensioning the cylindrical cavity so that it may be operated in a higher mode, such an approach in practice has proven difficult to implement in a satisfactory manner. If, for example, the cylindrical cavity is dimensioned to support the $TM_{020}$ mode, then some mode suppression means must be provided to prevent the undesired modes such as the $TM_{210}$ and $TM_{110}$ modes from existing. Any such means obviously increases the overall complexity of the arrangement and introduces some power dissipative elements in the cylindrical cavity which, in turn, reduce the efficiency with which the radio frequency energy from the coaxial oscillator circuits is combined.

SUMMARY OF THE INVENTION

In view of the foregoing it is a principal object of this invention to provide an improved power combiner, or accumulator, wherein radio frequency energy from each one of N sets of coaxial oscillator circuits (each of which sets in turn being made up of a plurality of coaxial oscillator circuits) may be added.

Another object of this invention is to provide an improved power combiner as above wherein there are N cylindrical subcavities, each operating in the $TM_{010}$ mode to combine the radio frequency energy from a plurality of coaxial oscillator circuits, and a central cavity, also operating in the $TM_{010}$ mode, to combine the radio frequency energy in the subcavities.

The foregoing and other objects of this invention are generally attained by providing, in a power combiner for radio frequency energy produced by a plurality of solid state oscillators using IMPATT diodes as the active elements, N subcavities and a central cavity similarly dimensioned to operate in the $TM_{010}$ mode at a given frequency, means for mounting coaxial oscillator circuits around the greater part of the periphery of each one of the subcavities and coupling means coacting between the remaining part of each one of the subcavities and the periphery of the central cavity in such a manner that the radio frequency energy in the central cavity is substantially equal to the sum of the radio frequency energy produced by all of the coaxial oscillator circuits.

BRIEF DESCRIPTION OF THE DRAWINGS

For a more complete understanding of this invention, reference is now made to the following description of the accompanying drawings, wherein.

DESCRIPTION OF THE PREFERRED EMBODIMENT

Figure 1:
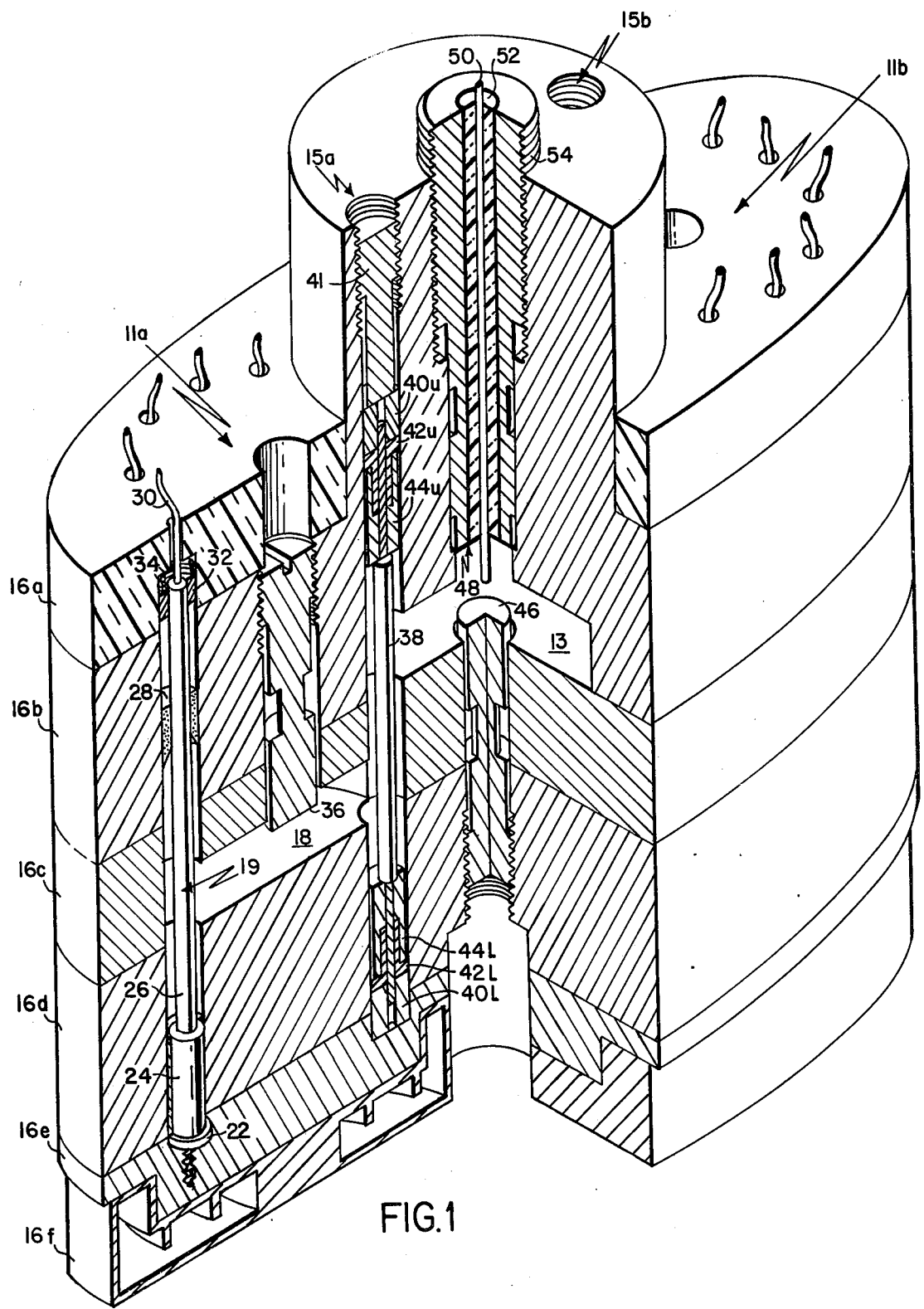
FIG. 1 is an isometric view, partially broken away, of a power combiner according to this invention, the illustrated combiner being simplified for ease of exposition.

Before referring to FIG. 1 in detail, it should be noted that ancillary, but necessary in an operative arrangement, parts and elements have not been illustrated. For example, mechanical elements such as bolts or screws to hold the illustrated power combiner together have not been shown, nor have a cooling medium and pump, IMPATT diode biasing means and input/output circuitry to connect the illustrated power combiner to a locking source and a load. It is felt that a person of ordinary skill in the art would not have to experiment to provide the just-mentioned parts and elements, or other conventional parts or elements, to reproduce the contemplated power combiner.

With the foregoing in mind, it may be seen in FIG. 1 that the contemplated power combiner comprises two subcavity assemblies 11a, 11b and a central cavity 13 disposed so that each one of the subcavity assemblies 11a, 11b may be coupled, by means of a coupling section 15a or a coupling section 15b, to the central cavity 13. The just-mentioned assemblies are here supported, in ways to be described, in a unitary body formed for convenience of machining, by appropriately shaped body sections 16a, 16b, 16c, 16d, 16e, 16f. Because the subcavity assemblies 11a, 11b and the coupling sections 15a, 15b are identical, only subcavity assembly 11a and coupling section 15a will be described.

Subcavity assembly 11a includes a cylindrical cavity 18 (here formed by counterboring body section 16c and plating the exposed portions of that body and the opposing portion of body section 16d) dimensioned to support the $TM_{010}$ mode at the design frequency. A number of coaxial oscillator circuits, such as that indicated by the reference numeral 19, are supported as shown around a portion of the periphery of the cylindrical cavity 18. Each one of the coaxial oscillator circuits includes an IMPATT diode 22, and impedance transformer 24, a center conductor 26, a load 28 and a biasing lead 30 within appropriately shaped bores in body sections 16a, 16b, 16c, 16d and 16e. A metallic collar 32 and a spring member 34 are provided to support the upper end of the center conductor 26. A liquid coolant (not shown) is passed in any convenient manner through a passage in body section 16f. Finally, a tuning slug 36 is disposed as shown to project into the cylindrical cavity 18. When a proper biasing voltage is applied from a source (as, for example, that shown in the pending application Ser. No. 814,744, filed June 30, 1977, entitled "Solid State Power Combiner," inventor Ronald M. Wallace, and assigned to the same assignee as the present application) the IMPATT diodes 19 on the periphery of the cylindrical cavity 18 are caused to oscillate and the cylindrical cavity 18 is effective to "lock" such circuits, i.e., to cause the coaxial oscillator circuits 19 to oscillate in phase with one another. To put it another way, the desired combining of the energy of all of the cylindrical oscillator circuits 18 is effected.

The $TM_{010}$ field set up in the cylindrical cavity 18 is coupled to the central cavity 13 through coupling section 15a in a manner now to be described. Thus, a coaxial line (not numbered), with a center conductor 38 and an outer conductor (not numbered) formed as shown by appropriate bores in the body sections 16b, 16c, 16d and 16e, is disposed so that the center conductor 38 is exposed to both the cylindrical cavity 18 and the central cavity 13. The center conductor 38 is positioned with respect to the central cavity 13 and the cylindrical cavity 18 by opposing metallic sleeves 40u, 40l, fitted respectively in the bores in body section 16b and body sections 16d, 16e, with metallic sleeve 40u being held in place by a threaded member 41. A capped dielectric sleeve 42u, 42l and a formed sleeve 44u, 44l are disposed as shown so that electrical shorts at the selected frequency of operation are reflected at the inner faces of the formed sleeves 44u, 44l. To accomplish such reflection, the lengths of the capped dielectric sleeves 42u, 42l are one-quarter the wavelength of the radio frequency energy to be combined. The distance from the metallic sleeves 40u, 40l to the inner faces of the formed sleeves 44u, 44l is also one-quarter wavelength of the radio frequency energy to be combined. The distance from the inner face of the formed sleeve 44u to the horizontal centerline (not shown) of the central cavity 13 is approximately one-half wavelength; the distance from the inner face of the formed sleeve 44l to the horizontal centerline (not shown) of the cylindrical cavity 18 is approximately one-half wavelength; and the distance between the horizontal centerlines of the central cavity 13 and the cylindrical cavity 18 is approximately one-half wavelength.

To complete the assembly being described, a tuning plug 46 and a probe 48 are adjustably mounted as shown in the center of the center cavity 13. The probe 48 is, as is conventional, a length of coaxial line with a center conductor 50, an insulating sleeve 52 and a metallic shield 54, threaded as shown in the body section 16b to permit adjustment of the distance to which the center conductor 50 may be inserted in the central cavity 13. The outside portion of the probe 48 is shaped to accommodate a coaxial connector (not shown) to allow connection to a circulator (not shown) when the described arrangement is to be injection-locked or connected to a load (not shown).

Figure 2:
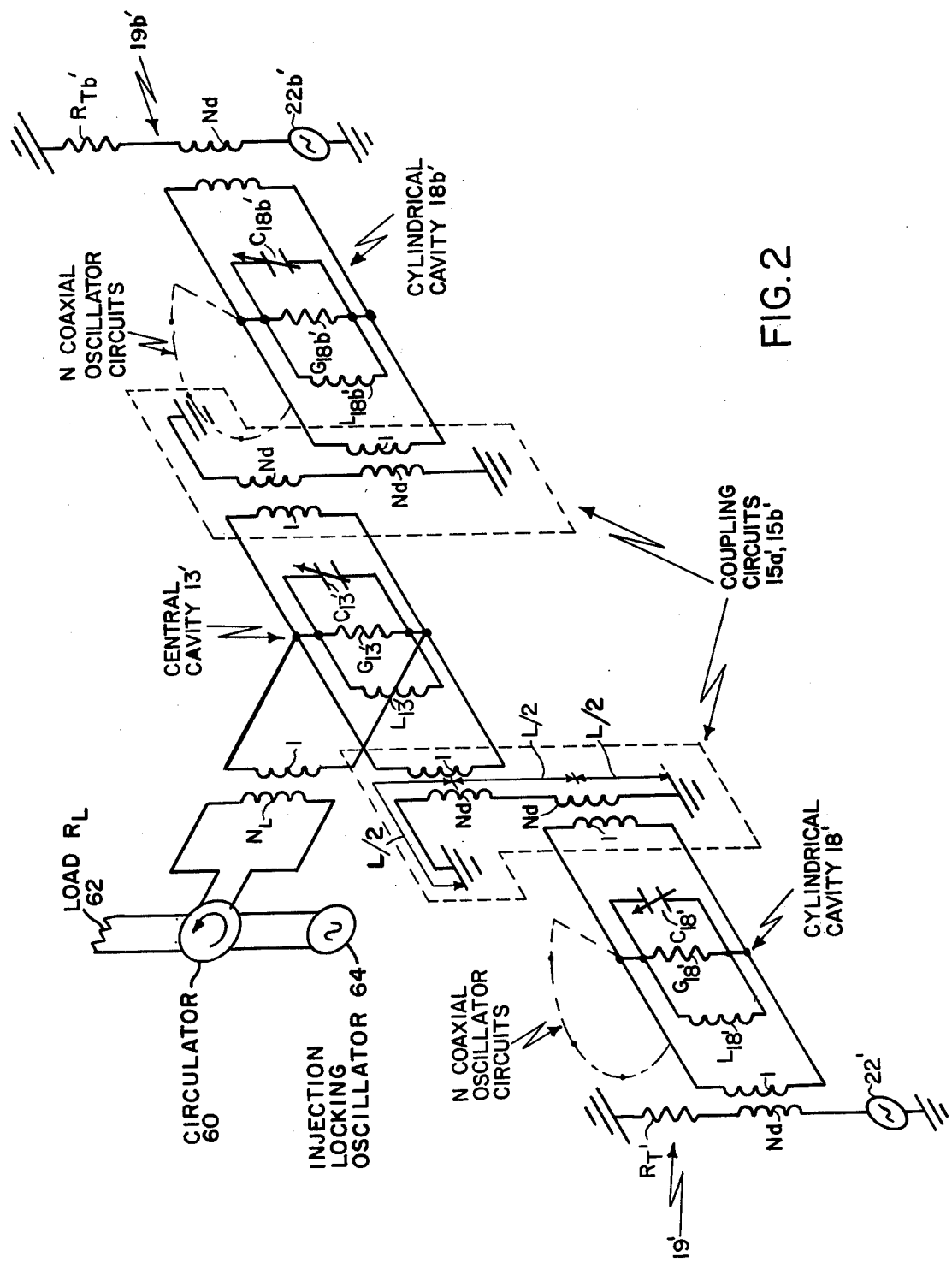
FIG. 2 is an equivalent circuit diagram of the power combiner of FIG. 1, showing also how proper operation may be ensured through injection-locking of the radio frequency energy in the various cavities.

The equivalent circuit of FIG. 2 has been simplified by showing only coaxial oscillator circuits 19', 19b' coupled to the cylindrical cavities 18', 18b' and by representing each such circuit as the series combination of a source of oscillations 22' or 22b', a primary winding, $N_d$, of a transformer (not numbered but having a ratio of Nd:1) and a resistor RT or RTb (corresponding to the load 28, FIG. 1). The transformer coupling indicates that the TEM mode in each of the coaxial oscillator circuits is magnetically linked to the $TM_{010}$ mode in each cylindrical cavity 18', 18b'. The representation of the coaxial oscillator circuits 19', 19b' is here simplified for expository reasons, it being assumed that persons of skill in the art are familiar with the theory of operation of coaxial oscillator circuits using IMPATT diodes in combination with a resonant cavity. Also, because each one of the N coaxial oscillator circuits is, for all practical purposes, coupled to the cylindrical cavity 18' in an identical manner, the representation of only a single coaxial oscillator circuit 19' or 19b' is valid, and a detailed description of how energy from one of the cylindrical cavities (here 18') is coupled to the central cavity 13' will suffice for an understanding of this invention. Additionally, the probe 48 (FIG. 1) is shown to be connected, via a circulator 60, to a load 62 and an injection-locking oscillator 64. It will also be noted that the three cavities are represented by a parallel combination of an inductance L18', L13', L18b', a capacitance C18', C13', C18b' and a conductance G18', G13', G18b' (where the numerals correspond to the reference numerals of the various cavities in FIG. 1). The admittance of each cavity is represented by Y18, Y13, Y18b. At resonance, of course, the impedances of the inductances and capacitances cancel, leaving only the conductances G18', G13', G18b'.

With the foregoing in mind, it may be shown that the impedance, Z, presented by the cylindrical cavity 18' and the resistor RT' to the diode line is:

$$Z = R_{T'} + N' N N_d^2/((N'+1)Y_{18} + N_L^2/R_L) \qquad \text{Eq. (1)}$$

where

N' equals the number of cylindrical cavities;
N equals the number of coaxial oscillator circuits coupled to each cylindrical cavity;
$N_d$ equals the transformer ratio of the transformer coupling each coaxial oscillator circuit to a cylindrical cavity;
$N_L$ equals the transformer ratio of the transformer coupling the load (here taken to be a resistance $R_L$) to the central cavity.

Inspection of Eq. (1) shows that the magnitude of the second term on the right hand side is dependent upon the admittance of the cylindrical cavity 18', such magnitude being a maximum when the frequency of the signal out of the source of oscillations 22' is at the resonant frequency of the cylindrical cavity 18'. The admittance of the cylindrical cavity 18' is then purely resistive and is equal to G18' with the result that substantially all of the energy from the source of oscillations is coupled to the cylindrical cavity 18'. When the frequency is changed, the reactance of L18', C18' cause $Y_{18}$ to increase, thereby changing the ratio between the magnitudes of the terms on the right hand side of Eq. (1). Physically, then, a greater proportion of the energy out of the source of oscillations 22' is dissipated in $R_{T'}$.

In order to extract energy from the cylindrical cavity 18' in an efficient manner, it is necessary to provide coupling circuitry which will not significantly distort the field in such cavity. Such an end is here accomplished by providing a coupling circuit 15a' which (as shown in FIG. 1) includes a coaxial line wherein the center conductor 38 is positioned on the periphery of the cylindrical cavity 18. The $TM_{010}$ mode in the cylindrical cavity 18 is, therefore, coupled to such coaxial line and energy propagated therein in the TEM mode. In order to extract the maximum amount of energy from the cylindrical cavity 18 the short circuit between the center conductor 38 (FIG. 1) and the body section 16d (FIG. 1) is nominally located one-half wavelength below the horizontal centerline of the cylindrical cavity 18 (FIG. 1). Discontinuities between the coaxial line and the cylindrical cavity 18' may force adjustment of the length of coaxial line in an empirical manner using known testing techniques. As shown in FIG. 2, the coupling circuit 15a' appears to the cylindrical cavity 18' as a transformer shown schematically the same as the transformer coupling the source of oscillations 22' to that cavity.

In order to couple the energy in the coupling circuit 15a' to the central cavity 13', the TEM mode in the coaxial line is coupled to a point on the periphery of the central cavity 13' so as to set up a $TM_{0N0}$ mode (here the $TM_{010}$ mode) in such cavity. To maintain the proper impedance match, the horizontal centerlines of the cylindrical cavity 18' and the central cavity 13' are here spaced approximately one-half wavelength apart, and the upper end of the center conductor 38 (FIG. 1) is terminated in a short circuit at approximately one-half wavelength from the horizontal centerline of the central cavity 13'. Again, discontinuities may force adjustment of the length of coaxial line.

As shown in FIG. 1, a conventional E-probe is centrally located with respect to the central cavity 13. For convenience, such probe is represented here as a transformer with a ratio of 1:$N_L$. The secondary winding of the transformer is connected to a circulator 60 to allow further connection to a load, $R_L$, and to an injection-locking oscillator 64 (here shown to be a continuous wave device) which serves to set up a $TM_{010}$ field in the central cavity 13' and, through the coupling circuits 15a', 15b', similar fields in the cylindrical cavities 18', 18b'. Such fields then ensure rapid synchronization of the coaxial oscillator circuits 19', 19b', especially when pulsed operation is desired. It will be recognized that the illustrated arrangement allows some energy from the injection-locking oscillator 64 always to be passed to the load $R_L$. If it is necessary to prevent such an occurrence between pulses out of the central cavity 13', it is obvious that an appropriately timed radio frequency switch may be inserted between the circulator 20 and the load $R_L$.

Having described a preferred embodiment of this invention, it will now be evident to one of ordinary skill in the art that changes may be made without departing from our concept of coupling a plurality of $TM_{010}$ cavities to combine the outputs of more coaxial oscillator circuits than possible with a single $TM_{010}$ cavity. Thus, the number of cylindrical subcavities and the relative sizes of such cavities (still maintaining the $TM_{010}$ mode) may be changed or the figures of merit of the cylindrical subcavities may be lowered. Also, so long as the length of the center conductor in the coupling circuit is kept at an integral multiple of a half-wavelength, the spacing between cavities may be changed. It is felt, therefore, that this invention should not be restricted to its disclosed embodiment, but rather should be limited only by the spirit and scope of the appended claims.

What is claimed is:

1. A power combiner for radio frequency energy produced by a plurality of solid state diode oscillators, each one of such oscillators including an IMPATT diode in a coaxial line oscillator circuit, such combiner comprising:
    (a) at least a pair of cylindrical cavities, each dimensioned to support the $TM_{010}$ mode of oscillation;
    (b) means for mounting coaxial line oscillator circuits about a portion of the periphery of each one of the cylindrical cavities in a coupling relationship thereto;
    (c) a central cylindrical cavity dimensioned to support a transverse magnetic mode of oscillation;
    (d) a separate coaxial line disposed between a point on the periphery of each one of the cylindrical cavities and the periphery of the central cylindrical cavity to couple each one of the cylindrical cavities to the central cylindrical cavity; and
    (e) means for coupling radio frequency energy out of the central cylindrical cavity.

2. The power combiner of claim 1 wherein the central cylindrical cavity is dimensioned to support the $TM_{010}$ mode of oscillation.

3. The power combiner of claim 2 wherein each separate coaxial line supports the TEM mode of oscillation between a center conductor and a shield, the latter being formed to allow the former to be positioned at the periphery of the cylindrical cavities and at the periphery of the central cylindrical cavity.

4. The power combiner of claim 3 wherein the electrical distance between the central cylindrical cavity is, measured along the center conductor of the coaxial line, substantially equal to one-half wavelength.

5. The combiner of claim 4 wherein the free ends of the center conductor in each coaxial line are shortcircuited at a distance of one-half wavelength from the central cylindrical cavity and the cylindrical cavity.

* * * * *